(12) United States Patent
Asami et al.

(10) Patent No.: US 8,785,766 B2
(45) Date of Patent: Jul. 22, 2014

(54) PHOTOELECTRIC CONVERSION DEVICE AND ENERGY CONVERSION LAYER FOR PHOTOELECTRIC CONVERSION DEVICE

(75) Inventors: Yoshinobu Asami, Kanagawa (JP); Tomokazu Yokoi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 16 days.

(21) Appl. No.: 13/161,669

(22) Filed: Jun. 16, 2011

(65) Prior Publication Data
US 2011/0308590 A1   Dec. 22, 2011

(30) Foreign Application Priority Data
Jun. 18, 2010 (JP) .................................. 2010-139746

(51) Int. Cl.
*H01L 31/06* (2012.01)
(52) U.S. Cl.
USPC ............ 136/255; 136/256; 136/261; 136/252
(58) Field of Classification Search
USPC .................................. 136/255, 256, 261, 252
See application file for complete search history.

(56) References Cited

U.S. PATENT DOCUMENTS

| | | | | |
|---|---|---|---|---|
| 4,718,947 | A * | 1/1988 | Arya .............................. | 136/258 |
| 6,275,137 | B1 * | 8/2001 | Doppalapudi et al. ............ | 338/2 |
| 6,372,980 | B1 * | 4/2002 | Freundlich .................... | 136/255 |
| 7,791,157 | B2 | 9/2010 | Cho et al. | |
| 2008/0196761 | A1 * | 8/2008 | Nakano et al. ................. | 136/258 |
| 2009/0165839 | A1 * | 7/2009 | Zeman et al. ................. | 136/244 |
| 2010/0282309 | A1 * | 11/2010 | Pschirer et al. ............... | 136/255 |
| 2011/0017292 | A1 | 1/2011 | Cho et al. | |

FOREIGN PATENT DOCUMENTS

| | | |
|---|---|---|
| JP | 7-142752 | 6/1995 |
| JP | 2006-216560 | 8/2006 |
| JP | 2009-223309 | 10/2009 |
| WO | WO 2009/013282 A1 * 1/2009 | ............... H01G 9/20 |

OTHER PUBLICATIONS

Klimov, V.I., "Detailed-Balance Power Conversion Limits of Nanocrystal-Quantum-Dot Solar Cells in the Presence of Carrier Multiplication," Applied Physics Letters, vol. 89, No. 12, Sep. 21, 2006, pp. 123118-1-123118-3.

Beard, M.C., et al, "Multiple Exciton Generation in Colloidal Silicon Nanocrystals," Nano Letters, vol. 7, No. 8, Jul. 24, 2007, pp. 2506-2512.

* cited by examiner

*Primary Examiner* — Golam Mowla
(74) *Attorney, Agent, or Firm* — Husch Blackwell LLP

(57) ABSTRACT

A novel photoelectric conversion device in which energy of light can be effectively utilized and performance can be improved is provided. A photoelectric conversion device includes a photoelectric conversion element and an energy conversion layer provided on a light-receiving side of a photoelectric conversion layer included in the photoelectric conversion element. The energy conversion layer includes a plurality of first layers and a plurality of second layers. The first layer and the second layer are alternately stacked. The thickness of the first layer is greater than or equal to 0.5 nm and less than or equal to 10 nm, and the thickness of the second layer is greater than or equal to 0.5 nm and less than or equal to 10 nm. The second layer can be formed using a material having a larger energy band gap than that of a material used for the first layer.

20 Claims, 9 Drawing Sheets

PHOTOELECTRIC CONVERSION DEVICE AND ENERGY CONVERSION LAYER FOR PHOTOELECTRIC CONVERSION DEVICE

BACKGROUND OF THE INVENTION

1. Field of the Invention

An embodiment of the present invention relates to a photoelectric conversion device such as a solar cell.

2. Description of the Related Art

A photoelectric conversion device such as a solar cell has been actively researched and developed. The spectrum of the sunlight widely ranges from light with a short wavelength (such as ultraviolet light) to light with a long wavelength (such as infrared light). Energy of light with a short wavelength is higher than energy of light with a long wavelength. Therefore, when energy of light with a short wavelength can be efficiently utilized, the conversion efficiency of a solar cell can be improved.

For example, it has been attempted to improve the conversion efficiency of a solar cell by using a wavelength conversion layer (e.g., Patent Document 1).

REFERENCE

Patent Document

[Patent Document 1] Japanese Published Patent Application No. H7-142752

SUMMARY OF THE INVENTION

However, even when a photoelectric conversion layer absorbs light with a short wavelength whose energy is higher than that of the energy band gap of the photoelectric conversion layer, energy which is not within the energy range of the energy band gap of the photoelectric conversion layer is released as thermal energy, and cannot be taken out as power of a solar cell.

In view of the above, it is an object to provide a novel photoelectric conversion device in which energy of light can be effectively utilized and performance can be improved. In addition, it is an object to provide a photoelectric conversion device in which energy of visible light with a shorter wavelength than ultraviolet light can be effectively utilized. Moreover, it is an object to provide an energy conversion layer for a photoelectric conversion device which can improve the performance of the photoelectric conversion device.

A photoelectric conversion device including a photoelectric conversion element and an energy conversion layer provided on a light-receiving side of a photoelectric conversion layer included in the photoelectric conversion element is proposed. In addition, an energy conversion layer for a photoelectric conversion device is proposed.

An energy conversion layer includes a plurality of first layers and a plurality of second layers and has a structure in which the first layer and the second layer are alternately stacked. The first layer is sandwiched between the second layers. The second layers are provided in an uppermost layer and a lowermost layer of the energy conversion layer.

The thickness of each of the plurality of first layers is greater than or equal to 0.5 nm and less than or equal to 10 nm. The plurality of first layers may have the same thickness or different thicknesses.

The thickness of each of the plurality of second layers is greater than or equal to 0.5 nm and less than or equal to 10 nm. The plurality of second layers may have the same thickness or different thicknesses. The second layers provided in the uppermost layer and the lowermost layer of the energy conversion layer may have a thickness of greater than or equal to 10 nm.

The total thickness of the energy conversion layer can be greater than or equal to 20 nm and less than or equal to 10 μm.

In the above structure, the first layer can be formed using the same material as a photoelectric conversion layer. Alternatively, the first layer can be formed using a material having a larger energy band gap than that of a material used for the photoelectric conversion layer. For example, the first layer can be formed using silicon.

In the above structure, the second layer can be formed using a material having a larger energy band gap than that of a material used for the first layer. For example, the second layer can be formed using silicon nitride that is a compound containing silicon and nitrogen, silicon nitride oxide (SiNxOy, (x>y>0)), silicon oxynitride (SiOxNy, (x>y>0)), or silicon oxide that is a compound containing silicon and oxygen.

The energy conversion layer has a function of generating a plurality of photons from one photon. The energy conversion layer can generate, from one photon having high energy (e.g., energy corresponding to that of light with a wavelength of less than or equal to 553 nm, that is, energy of greater than or equal to 2.24 eV), a plurality of photons having lower energy than that of the one photon (e.g., energy corresponding to that of light with a wavelength of greater than 553 nm and less than or equal to 1107 nm, that is, energy of greater than or equal to 1.12 eV and less than 2.24 eV).

The energy conversion layer can have a quantum well structure, and a multiple quantum well structure or a structure including a plurality of single quantum well structures can be used. The first layer can be used as a layer forming a quantum well, and the second layer can be used as a layer forming an energy barrier. With a quantum well structure, an electron state around the valence band and the conduction band is quantized in a one-dimensional direction (such as a thickness direction) and a state in which energy levels are discrete can be obtained.

In addition, the energy conversion layer includes a first unit and a second unit. The first unit includes a plurality of first layers with a first thickness and a plurality of second layers with a second thickness. The first layer and the second layer are alternately stacked. The second unit includes a plurality of third layers with a third thickness and a plurality of fourth layers with a fourth thickness. The third layer and the fourth layer are alternately stacked. In addition, the energy conversion layer is not limited to have the two units of the first unit and the second unit, and may include three or more units.

In the above structure, the first thickness and the third thickness are each greater than or equal to 0.5 nm and less than or equal to 10 nm, and the second thickness and the fourth thickness are each greater than or equal to 0.5 nm and less than or equal to 10 nm. At least the first thickness and the third thickness are different from each other.

In the above structure, the first layer and the third layer can be used as a layer forming a quantum well, and the second layer and the fourth layer can be used as a layer forming an energy barrier. The first layer and the third layer can be formed using the same material as the first layer. For example, the first layer and the third layer can be formed using silicon. The second layer and the fourth layer can be formed using the same material as the second layer. For example, the second layer and the fourth layer can be formed using silicon nitride, silicon nitride oxide (SiNxOy, (x>y>0)), silicon oxynitride (SiOxNy, (x>y>0)), or silicon oxide.

In addition, the energy conversion layer can have a quantum wire structure. With a quantum wire structure, an electron state around the valence band and the conduction band is quantized in a two-dimensional direction and a state in which energy levels are discrete can be obtained.

In the case of the quantum wire structure, the energy conversion layer includes a plurality of first layers each having a longitudinal direction and a lateral direction and a second layer. Each of the plurality of first layers is surrounded by the second layer in a cross section perpendicular to a longitudinal direction. The plurality of first layers each having a longitudinal direction and a lateral direction are arranged at predetermined intervals in a thickness direction (also referred to as a direction vertical to the layer) and a lateral direction. The second layer is used as a layer forming an energy barrier.

The thickness of each of the plurality of first layers in a thickness direction is greater than or equal to 0.5 nm and less than or equal to 10 nm. The width of each of the plurality of first layers in a lateral direction is greater than or equal to 0.5 nm and less than or equal to 10 nm. The interval between the first layers in a thickness direction is greater than or equal to 0.5 nm and less than or equal to 10 nm. The interval between the first layers in a lateral direction is greater than or equal to 0.5 nm and less than or equal to 10 nm.

The plurality of first layers arranged in a thickness direction (also referred to as a direction vertical to the layer) may have the same thickness or different thicknesses. The plurality of first layers arranged in a thickness direction may have the same width or different widths in a lateral direction. The plurality of first layers arranged in a thickness direction may be provided at equal intervals or different intervals.

The plurality of first layers arranged in a lateral direction may have the same thickness or different thicknesses. The plurality of first layers arranged in a lateral direction may have the same width or different widths in a lateral direction. The plurality of first layers arranged in a lateral direction may be provided at equal intervals or different intervals.

In the above structure, the first layer can be formed using the same material as the photoelectric conversion layer. Alternatively, the first layer can be formed using a material having a larger energy band gap than that of a material used for the photoelectric conversion layer. For example, the first layer can be formed using silicon.

In the above structure, the second layer can be formed using a material having a larger energy band gap than that of a material used for the first layer. For example, the second layer can be formed using silicon nitride that is a compound containing silicon and nitrogen, silicon nitride oxide ($SiN_xO_y$, ($x>y>0$)), silicon oxynitride ($SiO_xN_y$, ($x>y>0$)), or silicon oxide that is a compound containing silicon and oxygen.

The energy conversion layer has a function of generating a plurality of photons from one photon. The energy conversion layer can generate, from one photon having high energy (e.g., energy corresponding to that of light with a wavelength of less than or equal to 553 nm, that is, energy of greater than or equal to 2.24 eV), a plurality of photons having lower energy than that of the one photon (e.g., energy corresponding to that of light with a wavelength of greater than 553 nm and less than or equal to 1107 nm, that is, energy of greater than or equal to 1.12 eV and less than 2.24 eV).

In addition, the energy conversion layer can include a quantum dot layer. The quantum dot layer includes a plurality of quantum dots and a first layer. The plurality of quantum dots are surrounded by the first layer in a longitudinal direction, a lateral direction, and a thickness direction. In addition, the energy conversion layer may have a structure in which a plurality of quantum dot layers are stacked. In such a case, the average diameters of a plurality of quantum dots in the quantum dot layers preferably differ from one quantum dot layer to another.

In the above structure, the average diameter of the plurality of quantum dots is greater than or equal to 0.5 nm and less than or equal to 10 nm. The interval between the plurality of quantum dots in a longitudinal direction is greater than or equal to 0.5 nm and less than or equal to 10 nm. In addition, the interval between the plurality of quantum dots in a lateral direction is greater than or equal to 0.5 nm and less than or equal to 10 nm. In addition, the interval between the plurality of quantum dots in a thickness direction is greater than or equal to 0.5 nm and less than or equal to 10 nm.

In the above structure, the plurality of quantum dots and the first layer form a quantum dot layer, and the first layer can be used as a layer forming an energy barrier. For example, the first layer can be formed using silicon nitride, silicon nitride oxide ($SiN_xO_y$, ($x>y>0$)), silicon oxynitride ($SiO_xN_y$, ($x>y>0$)), or silicon oxide. The plurality of quantum dots can be formed using silicon.

The energy conversion layer can have a quantum dot structure. With a quantum dot structure, an electron state around the valence band and the conduction band is quantized in a three-dimensional direction and a state in which energy levels are discrete can be obtained.

In the case of the quantum dot structure, the energy conversion layer includes a plurality of quantum dots arranged in a longitudinal direction, a lateral direction, and a thickness direction. The plurality of quantum dots are surrounded by a first layer. Note that the plurality of quantum dots are arranged uniformly at predetermined intervals in each of a longitudinal direction, a lateral direction, and a thickness direction.

In the above structure, the plurality of quantum dots can be formed using the same material as the photoelectric conversion layer. Alternatively, the plurality of quantum dots can be formed using a material having a larger energy band gap than that of a material used for the photoelectric conversion layer. For example, the plurality of quantum dots can be formed using silicon.

In the above structure, the first layer can be formed using a material having a larger energy band gap than that of a material used for the plurality of quantum dots. For example, the first layer can be formed using silicon nitride that is a compound containing silicon and nitrogen, silicon nitride oxide ($SiN_xO_y$, ($x>y>0$)), silicon oxynitride ($SiO_xN_y$, ($x>y>0$)), or silicon oxide that is a compound containing silicon and oxygen.

The energy conversion layer has a function of generating a plurality of photons from one photon. The energy conversion layer can generate, from one photon having high energy (e.g., energy corresponding to that of light with a wavelength of less than or equal to 553 nm, that is, energy of greater than or equal to 2.24 eV), a plurality of photons having lower energy than that of the one photon (e.g., energy corresponding to that of light with a wavelength of greater than 553 nm and less than or equal to 1107 nm, that is, energy of greater than or equal to 1.12 eV and less than 2.24 eV).

In the above structure, the photoelectric conversion element and the energy conversion layer can be provided over one substrate. When the photoelectric conversion element and the energy conversion layer are provided over one substrate, as compared to the case where the photoelectric conversion element and the energy conversion layer are provided over different substrates, cost down, downsizing, and reduction in weight of the photoelectric conversion device can be achieved. In addition, optical loss due to substrates, which may be generated in the case where the photoelectric conversion element and the energy conversion layer are provided over different substrates, can be reduced.

It is possible to provide a novel photoelectric conversion device in which energy of light can be effectively utilized and performance such as conversion efficiency can be improved. In particular, it is possible to provide a photoelectric conversion device in which spectral sensitivity and quantum efficiency of visible light with a shorter wavelength than ultraviolet light can be increased and energy of light with a short wavelength can be effectively utilized. Moreover, it is possible to provide an energy conversion layer for a photoelectric conversion device which can improve the performance of the photoelectric conversion device.

DETAILED DESCRIPTION OF THE INVENTION

Figure 1A:
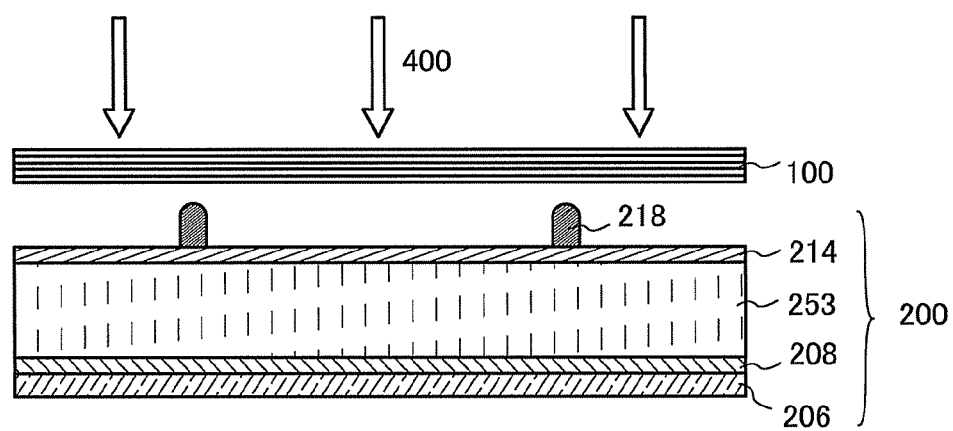
FIGS. 1A and 1B are cross-sectional schematic views illustrating an example of a photoelectric conversion device and an example of an energy conversion layer.

Hereinafter, embodiments and examples of the present invention will be described with reference to the drawings. However, the present invention is not limited to the following description. It will be readily appreciated by those skilled in the art that modes and details thereof can be modified in various ways without departing from the spirit and the scope of the present invention. Therefore, the present invention should not be interpreted as being limited to the description of the embodiments and the examples to be given below. Note that reference numerals denoting the same portions are commonly used in different drawings in describing the structure of the present invention.

Embodiment 1

In this embodiment, an example of a structure of a photoelectric conversion device and an example of a structure of an energy conversion layer according to an embodiment of the disclosed inversion will be described with reference to FIGS. 1A and 1B and FIGS. 2A to 2C.

FIG. 1A is a cross-sectional schematic view illustrating an example of a photoelectric conversion device. The photoelectric conversion device includes a photoelectric conversion element 200 and an energy conversion layer 100. The energy conversion layer 100 is provided on the light-receiving side of the photoelectric conversion element 200. Incident light 400 enters a photoelectric conversion layer 253 included in the photoelectric conversion element 200 through the energy conversion layer 100.

The photoelectric conversion element 200 includes a first electrode 206, the photoelectric conversion layer 253, and a second electrode 218. In addition, the photoelectric conversion element 200 includes a first semiconductor layer 208 containing an impurity element imparting one conductivity type and a second semiconductor layer 214 containing an impurity element imparting a conductivity type that is different from that of the impurity element contained in the first semiconductor layer 208. In the photoelectric conversion element 200, the first electrode 206, the first semiconductor layer 208, the photoelectric conversion layer 253, the second semiconductor layer 214, and the second electrode 218 are stacked in this order.

The photoelectric conversion layer 253 can be formed using silicon. For example, as a material of the photoelectric conversion layer 253, crystalline silicon (such as single crystal silicon, polycrystalline silicon, or microcrystalline silicon) or amorphous silicon can be used. In addition, a material containing crystalline silicon and amorphous silicon, a silicon material containing nitrogen or carbon, or the like may be used.

In the case where a semiconductor substrate is used as the photoelectric conversion layer 253, the first semiconductor layer 208 and the second semiconductor layer 214 are formed in such a manner that impurity elements imparting respective conductivity types are added to the semiconductor substrate by thermal diffusion, an ion doping method, or the like. Alternatively, the first semiconductor layer 208 and the second semiconductor layer 214 may each be formed using a material different from that of the photoelectric conversion layer 253 or a material having a crystal state different from that of the photoelectric conversion layer 253 by a PECVD method, a thermal CVD method, or a sputtering method. For example, a p-type crystalline silicon wafer can be used as the photoelectric conversion layer 253, n-type crystalline silicon obtained by doping with phosphorus imparting n-type conductivity can be used as the second semiconductor layer 214, and p-type crystalline silicon obtained by doping with boron or aluminum imparting p-type conductivity can be used as the first semiconductor layer 208.

The second electrode 218 is formed with a gird shape or a comb-like shape such that the light-receiving area of the photoelectric conversion element 200 can be large and increase in resistance along with reduction in area of the electrode can be compensated for.

Although not illustrated in FIG. 1A, a material preventing optical reflection (such as a silicone resin or an organic resin) may be provided between the energy conversion layer 100 and the photoelectric conversion element 200. In that case, a material preventing optical reflection fills a region between the energy conversion layer 100 and the photoelectric conversion element 200. In addition, although each layer in the photoelectric conversion element 200 is illustrated as being flat in FIG. 1A, a texture structure in which the shape of the second semiconductor layer 214 and the light-receiving side of the photoelectric conversion layer 253 and the shape of the first semiconductor layer 208 and the rear side of the photoelectric conversion layer 253 are made uneven may be employed. With the texture structure, the reflectivity on the light-receiving side can be reduced and light confinement in the photoelectric conversion layer 253 is possible. Accordingly, photoelectric current can be increased and the photoelectric conversion layer 253 can be thinned, so that costs can be cut.

Figure 1B:
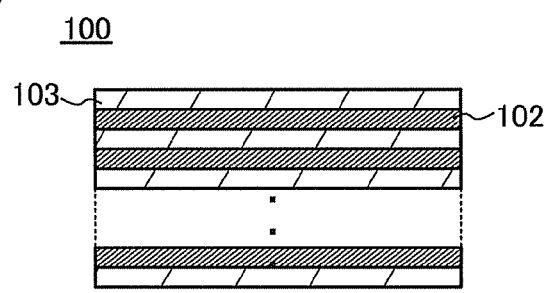

FIG. 1B is a cross-sectional schematic view illustrating, by enlarging, an example of the energy conversion layer 100 included in the photoelectric conversion device. The energy conversion layer 100 includes a plurality of first layers 102 and a plurality of second layers 103, and the first layer 102 and the second layer 103 are alternately stacked. The first layer 102 is sandwiched between the second layers 103 in a vertical direction.

The thickness of each of the plurality of first layers 102 is greater than or equal to 0.5 nm and less than or equal to 10 nm. The plurality of first layers 102 may have the same thickness or different thicknesses.

The thickness of each of the plurality of second layers 103 is greater than or equal to 0.5 nm and less than or equal to 10 nm. The plurality of second layers 103 may have the same thickness or different thicknesses. The second layers 103 provided in an uppermost layer and a lowermost layer of the energy conversion layer 100 may have a thickness of greater than or equal to 10 nm.

The total thickness of the energy conversion layer 100 can be greater than or equal to 20 nm and less than or equal to 10 μm.

The first layer 102 can be formed using the same material as the photoelectric conversion layer 253. Alternatively, the first layer 102 can be formed using a material having a larger energy band gap than that of a material used for the photoelectric conversion layer 253. For example, the first layer 102 can be formed using silicon (crystalline silicon or amorphous silicon).

The second layer 103 can be formed using a material having a larger energy band gap than that of a material used for the first layer 102. For example, the second layer 103 can be formed using silicon nitride, silicon nitride oxide (SiNxOy, (x>y>0)), silicon oxynitride (SiOxNy, (x>y>0)), or silicon oxide.

The energy conversion layer 100 can be provided over a substrate where the photoelectric conversion element 200 is not formed or a substrate where the photoelectric conversion element 200 is formed. The energy conversion layer 100 can be formed by a PECVD method, a thermal CVD method, a molecular beam epitaxy (MBE) method, an evaporation method, a sputtering method, or the like. The energy conversion layer 100 is formed in such a manner that the second layer 103 is formed in the lowermost layer, and then, the first layer 102 is formed to a thickness of greater than or equal to 0.5 nm and less than or equal to 10 nm over the second layer 103, and the second layer 103 is formed to a thickness of greater than or equal to 0.5 nm and less than or equal to 10 nm over the first layer 102. Further, over the second layer 103, the first layer 102 and the second layer 103 are alternately formed, and the second layer 103 is formed in the uppermost layer. For example, preferably, the first layer 102 is formed using silicon to a thickness of greater than or equal to 1 nm and less than or equal to 3 nm and the second layer 103 is formed using silicon oxide to a thickness of greater than or equal to 0.5 nm and less than or equal to 5 nm. Note that preferable thicknesses of the first layer 102 and the second layer 103 depend on materials which are used, the energy band gap, and the like. In addition, before formation of the first layer 102 or the second layer 103, a surface where the first layer 102 or the second layer 103 is formed may be subject to surface treatment such as plasma treatment. $N_2O$, $N_2$, Ar, $O_2$, or the like can be used for the atmosphere of the surface treatment.

In addition, although not illustrated in FIGS. 1A and 1B, in order to increase the amount of light that enters the energy conversion layer 100, one or more layers of a material having a refractive index between the refractive index of the second layer 103 and the refractive index of the air may be provided on the light-receiving side of the second layer 103 in the uppermost layer. In such a manner, the reflectivity of the surface of the energy conversion layer 100 can be reduced.

Figure 2A:
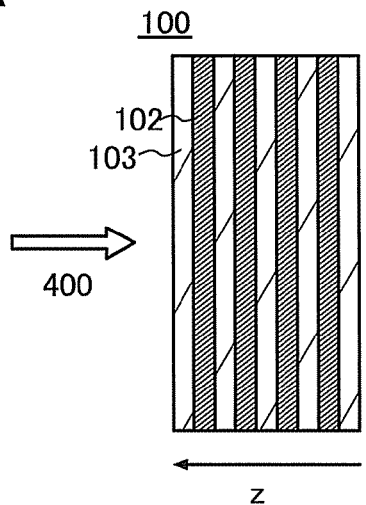
FIG. 2A is a cross-sectional schematic view illustrating an example of an energy conversion layer.

FIG. 2A is a cross-sectional schematic view illustrating, by enlarging, an example of the energy conversion layer 100 included in the photoelectric conversion device. Here, a thickness direction of the energy conversion layer 100 (a z direction in the drawing) corresponds to a lateral direction. FIG. 2A illustrates an example in which the energy conversion layer 100 includes four first layers 102 and five second layers 103, that is, nine layers in total. It is needless to say that the number of the first layers 102 and the second layers 103 which are stacked is not limited to those in this example, and the number may be greater than or equal to 20, preferably greater than or equal to 50. The first layer 102 and the second layer 103 are alternately stacked. In FIG. 2A, the incident light 400 enters from the left side of the energy conversion layer 100.

Figure 2B:
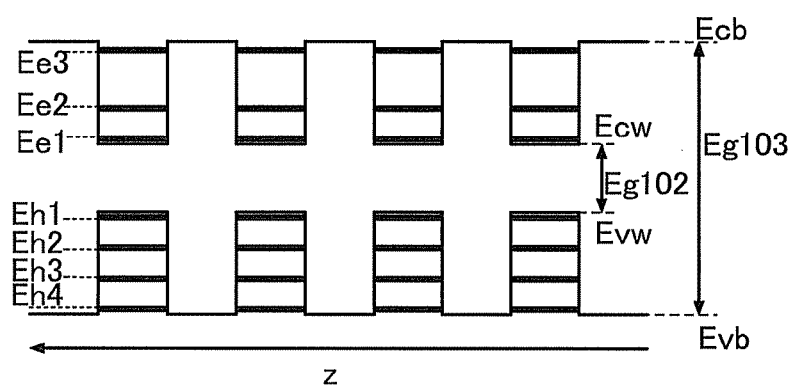
FIGS. 2B and 2C are diagrams illustrating examples of an energy band structure of the energy conversion layer.

FIG. 2B illustrates an example of an energy band structure of the energy conversion layer 100, in which the vertical axis indicates energy and the horizontal axis indicates the thickness of the energy conversion layer 100.

In the second layer 103, energy at the bottom of the conduction band is denoted by Ecb and energy at the top of the valence band is denoted by Evb. In the first layer 102, energy at the bottom of the conduction band is denoted by Ecw and energy at the top of the valence band is denoted by Evw. The energy band gap specific to a material of the second layer 103 is denoted by Eg103, and the energy band gap specific to a material of the first layer 102 is denoted by Eg102. The energy band gap Eg102 of the first layer 102 is smaller than the energy band gap Eg103 of the second layer 103.

As illustrated in FIGS. 2A and 2B, the energy conversion layer 100 has a structure in which the first layer 102 having a thin film shape (such as a thin film with a thickness of greater than or equal to 0.5 nm and less than or equal to 10 nm) in which the energy band gap Eg102 is small is sandwiched between the second layers 103 each having a thin film shape (such as a thin film with a thickness of greater than or equal to 0.5 nm and less than or equal to 10 nm) in which the energy band gap Eg103 is large. That is, the energy conversion layer 100 has a quantum well structure. The first layer 102 is a layer forming a quantum well (also referred to as a quantum well layer). Energy levels of electrons in the quantum well are discrete and divided into energy states called sub-bands (also referred to as mini-bands; Ee1, Ee2, Ee3, Eh1, Eh2, Eh3, and Eh4). The second layer 103 is a layer forming an energy barrier (also referred to as an energy barrier layer).

With a quantum well structure, an electron state around the valence band and the conduction band is quantized in a one-dimensional direction (such as a thickness direction or a z direction in the drawing) and a state in which energy levels are discrete can be obtained. An example in which the sub-bands, Ee1 to Ee3 and Eh1 to Eh4, are provided is illustrated here, but the present invention is not limited thereto. The number of sub-bands and the positions of the energy levels can be changed depending on the size and a material of the quantum well layer and the energy barrier layer forming a quantum well structure, the number of stacked quantum well layers and energy barrier layers, and the periodicity of a stack structure of the quantum well layer and the energy barrier layer included in the quantum well structure. By sufficiently reducing the total thickness of one quantum well layer and one energy barrier layer and uniformly arranging the quantum well layers and the energy barrier layers, a multiple quantum well structure is obtained and sub-bands are formed. With the thin quantum well layer, an electron state in the quantum well is quantized and energy levels are discrete; meanwhile, with the thin energy barrier layer, electron states in the adjacent quantum wells interfere with each other. By increasing the number of stacked quantum well layers and energy barrier layers, electron states in the adjacent quantum well layers interfere with each other in a wider range, and energy levels which are discrete in the quantum well are formed as subbands. By the formation of the sub-bands, the range of the wavelength of light for optical transition between the subbands is expanded, and the probability of light absorption in the energy conversion layer can be increased. With the use of a multiple quantum well structure, the effect of the energy conversion layer can be increased, and the energy of light can be utilized effectively. With the thick energy barrier layer, the sub-band is not formed, and in each quantum well, energy levels which are discrete are formed owing to only the quantum effect of a single quantum well. Accordingly, optical transition between discrete energy levels occurs only as for light having a specific wavelength, so that the effect of the energy conversion layer is not readily obtained. In that case, by varying the thicknesses of the quantum well layers, the energy levels of the quantum wells may be varied so as to improve the probability of light absorption in the energy conversion layer.

Figure 2C:
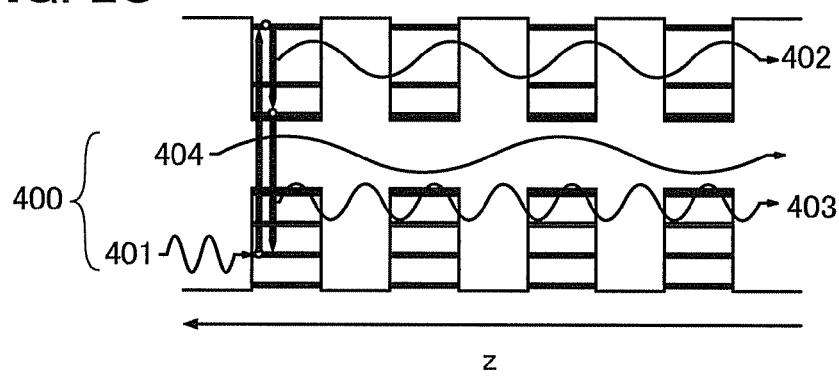

FIG. 2C illustrates an energy band structure of the energy conversion layer 100, and behavior of the incident light 400. As the incident light 400, for example, the sunlight or light emitted from a lighting device such as a fluorescent lamp is used. In the case where the sunlight is used as the incident light 400, the incident light 400 includes light with a wide range of wavelengths from light with a short wavelength (such as ultraviolet light) to light with a long wavelength (such as infrared light). Although the sub-bands Ee1 to Ee3 and Eh1 to Eh4 are not illustrated in FIG. 2C, since the energy band structure in FIG. 2B is the same as the energy band structure in FIG. 2C, the description is made by using Ee1 to Ee3 and Eh1 to Eh4 in FIG. 2B for the sub-bands.

A photon 401 of light with a short wavelength contained in the incident light 400 has higher energy than the energy band gap Eg102 (actually, higher energy than that of the band gap of the quantum well layer which corresponds to the energy difference between the bottom of the sub-band Ee1 and the top of the sub-band Eh1), so that the first layer 102 of the energy conversion layer 100 absorbs the light and electrons are excited therein. Since the selection rule of the optical transition is loose, when returning to the original level, the excited electron passes through the sub-band which exists between the energy levels without being controlled by the selection rule with a certain probability. At that time, the generation probability of a plurality of photons is determined by the number of energy levels through which the excited electron passes when returning to the original level.

For example, the photon 401 has an energy corresponding to the difference between the sub-band Ee3 and the sub-band Eh3 and thus excites an electron in the sub-band Eh3 to the sub-band Ee3 in the first layer 102 of the energy conversion layer 100. When returning to the sub-band Eh3, for example, the excited electron passes through the sub-band Ee1 which exists between Ee3 and Eh3. At that time, when the electron is transferred from the sub-band Ee3 to the sub-band Ee1, a photon 402 having an energy corresponding to the difference between the sub-band Ee3 and the sub-band Ee1 is generated. Further, when the electron is transferred from the sub-band Ee1 to the sub-band Eh3, a photon 403 having an energy corresponding to the difference between the sub-band Ee1 and the sub-band Eh3 is generated in the process of the transfer. In this manner, in the energy conversion layer 100, a plurality of photons (here, two photons), the photon 402 and the photon 403, are generated from one photon 401. Note that the energy of each of the photon 402 and the photon 403 which are generated is lower than energy corresponding to the difference between the sub-bands Ee3 and Eh3 of the original photon 401, and the photon 402 and the photon 403 have energy corresponding to the difference between the sub-band Ee3 and the sub-band Ee1 and energy corresponding to the difference between the sub-band Ee1 and the sub-band Eh3, respectively. Since the energy of the original photon 401 is conserved, the sum of energy of a plurality of generated photons (the photons 402 and 403) equals to the energy of the original photon 401 or lower than the energy of the original photon 401 owing to thermal energy loss in the process. Therefore, the wavelengths of the plurality of generated photons (the photons 402 and 403) are longer than the wavelength of the original photon 401. In this embodiment, an example in which the electron in the sub-band Eh3 is excited to the sub-band Ee3 is described, but an embodiment of the present invention is not limited thereto. An electron in another sub-band may be excited to the sub-band Ee3, or the electron may be excited to another sub-band.

A photon 404 of light with a long wavelength contained in the incident light 400 has lower energy than the band gap Eg103 and the band gap Eg102 (actually, lower energy than that of the band gap of the quantum well layer which corresponds to the energy difference between the bottom of the sub-band Ee1 and the top of the sub-band Eh1), so that the photon 404 passes through the energy conversion layer 100 without being absorbed by the energy conversion layer 100. Thus, light with a long wavelength can reach the photoelectric conversion layer placed in a lower layer of the energy conversion layer without loss due to light absorption.

As described above, the energy conversion layer 100 has a function of generating a plurality of photons from one photon. In particular, the energy conversion layer 100 can generate, from one photon of visible light with a shorter wavelength than ultraviolet light, which has high energy (e.g., energy corresponding to that of light with a wavelength of less than or equal to 553 nm, that is, energy of greater than or equal to 2.24 eV), a plurality of photons having lower energy than that of the one photon (e.g., energy corresponding to that of light with a wavelength of greater than 553 nm and less than or equal to 1107 nm, that is, energy of greater than or equal to 1.12 eV and less than 2.24 eV). Accordingly, it is possible to provide a photoelectric conversion device in which the quantum efficiency of light with a short wavelength such as visible light with a shorter wavelength than ultraviolet light can be increased and energy of light with a short wavelength can be effectively utilized, and an energy conversion layer for the photoelectric conversion device.

In accordance with this embodiment, it is possible to provide a novel photoelectric conversion device in which energy of light can be effectively utilized and performance such as conversion efficiency can be improved. Moreover, it is possible to provide an energy conversion layer for a photoelectric conversion device which can improve the performance of the photoelectric conversion device.

Embodiment 2

In this embodiment, an example of a structure of an energy conversion layer for a photoelectric conversion device according to an embodiment of the disclosed inversion will be described with reference to FIG. 3.

Figure 3:
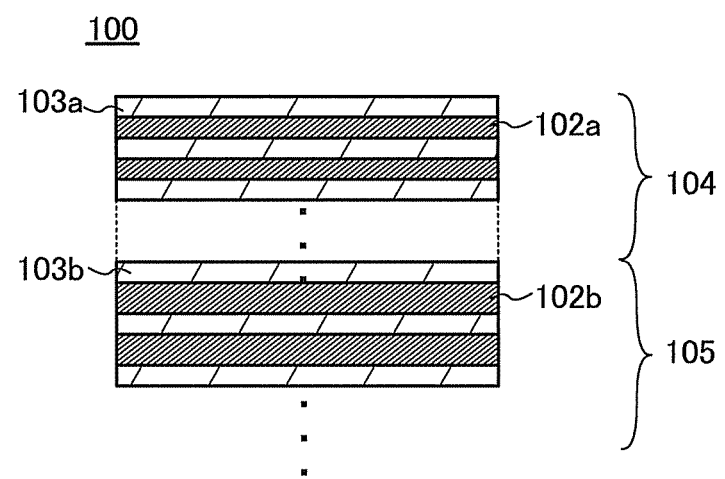
FIG. 3 is a cross-sectional schematic view illustrating an example of an energy conversion layer.

FIG. 3 is a cross-sectional schematic view illustrating, by enlarging, an example of an energy conversion layer 100 used in a photoelectric conversion device. The energy conversion layer 100 includes a first unit 104 and a second unit 105. The first unit 104 includes a plurality of first layers 102a with a first thickness and a plurality of second layers 103a with a second thickness, and the first layer 102a and the second layer 103a are alternately stacked. The second unit 105 includes a plurality of third layers 102b with a third thickness and a plurality of fourth layers 103b with a fourth thickness, and the third layer 102b and the fourth layer 103b are alternately stacked. Each of the plurality of first layers 102a is sandwiched between the second layers 103a in a vertical direction. Each of the plurality of third layers 102b is sandwiched between the fourth layers 103b in a vertical direction. In addition, although not illustrated in FIG. 3, in order to reduce the loss due to reflectivity of light that enters the energy conversion layer 100, one or more layers of a material having a refractive index between the refractive index of the second layer 103a and the refractive index of the air may be provided on the light-receiving side of the second layer 103a which is an uppermost layer of the first unit 104.

Each of the thickness (first thickness) of the first layer 102a and the thickness (third thickness) of the third layer 102b is greater than or equal to 0.5 nm and less than or equal to 10 nm. Note that the first layer 102a and the third layer 102b each form a quantum well layer. The first thickness and the third thickness are different from each other. In addition, each of the thickness (second thickness) of the second layer 103a and the thickness (fourth thickness) of the fourth layer 103b is greater than or equal to 0.5 nm and less than or equal to 10 nm. Note that the second layer 103a and the fourth layer 103b each form an energy barrier layer. The second thickness and the fourth thickness may be different from each other or the same.

The total thickness of the energy conversion layer 100 can be greater than or equal to 20 nm and less than or equal to 10 μm.

The first layer 102a or the third layer 102b may be formed using the same material as a photoelectric conversion layer. Alternatively, the first layer 102a or the third layer 102b may be formed using a material having a larger energy band gap than that of a material used for the photoelectric conversion layer. For example, the first layer 102a and the third layer 102b may be formed using the material of the first layer 102 described in Embodiment 1.

The second layer 103a can be formed using a material having a larger energy band gap than that of a material used for the first layer 102a, and the fourth layer 103b can be formed using a material having a larger energy band gap than that of a material used for the third layer 102b. For example, the second layer 103a and the fourth layer 103b may be formed using a material of the second layer 103 described in Embodiment 1.

When the first unit 104 including the plurality of first layers 102a with the first thickness and the second unit 105 including the plurality of third layers 102b with the second thickness are provided, a plurality of units with different sub-band structures of the quantum well layer can be formed. Accordingly, the generation probability of a plurality of photons of light with a long wavelength from one photon of light with a short wavelength, which has high energy, can be increased. When a single unit is provided, as illustrated in FIG. 2B, the sub-bands Ee1 to Ee3 and Eh1 to Eh4 are formed for example owing to the multiple quantum well structure. By the formation of the sub-bands, the range of the wavelength of light for optical transition between the sub-bands is expanded, and the probability of light absorption in the energy conversion layer can be increased. However, the wavelength range of light whose energy is converted in the energy conversion layer is limited to the wavelength range of light having energy which is the same or substantially the same as energy corresponding to the difference between the sub-bands. Therefore, the plurality of units having different sub-band structures are provided, the probability of light absorption in the energy conversion layer is increased, and thus the wavelength range of light is widened, whereby a plurality of photons of light with a long wavelength, which has low energy, can be generated from one photon of light with a short wavelength, which has high energy, in the energy conversion layer more effectively.

The energy conversion layer 100 described in this embodiment can be combined with the photoelectric conversion element 200 illustrated in FIG. 1A. In addition, an embodiment of the present invention is not limited to the two units of the first unit 104 and the second unit 105 described here, and may include three or more units.

In accordance with this embodiment, it is possible to provide a novel photoelectric conversion device in which energy of light can be effectively utilized and performance such as conversion efficiency can be improved. In addition, in accordance with this embodiment, it is possible to provide a photoelectric conversion device in which light that is visible light with a shorter wavelength than ultraviolet light, which has high energy, can be effectively utilized. Moreover, it is possible to provide an energy conversion layer for a photoelectric conversion device which can improve the performance of the photoelectric conversion device.

This embodiment can be combined with any of other embodiments as appropriate.

Embodiment 3

In this embodiment, an example of a structure of an energy conversion layer for a photoelectric conversion device according to an embodiment of the disclosed inversion will be described with reference to FIG. 4.

Figure 4:
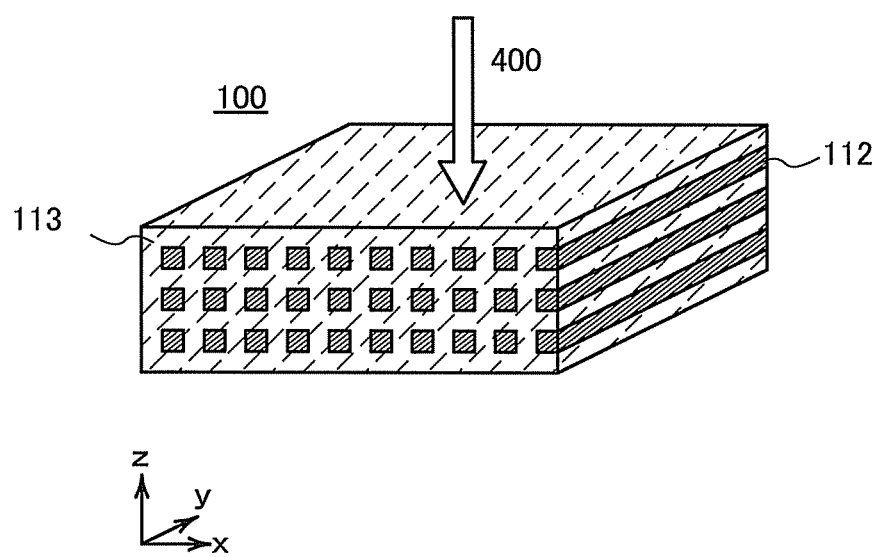
FIG. 4 is a perspective view illustrating an example of an energy conversion layer.

FIG. 4 is a perspective view illustrating an example of an energy conversion layer 100.

The energy conversion layer 100 includes a plurality of first layers 112 each having a longitudinal direction (a y direction in FIG. 4) and a lateral direction (a x direction in FIG. 4) and a second layer 113. Each of the plurality of first layers 112 is surrounded by the second layer 113 in a cross section in a lateral direction. The plurality of first layers 112 each having a longitudinal direction and a lateral direction are arranged at predetermined intervals in a thickness direction (also referred to as a vertical direction or a z direction in FIG. 4). The plurality of first layers 112 each having a longitudinal direction and a lateral direction are arranged at predetermined intervals in a lateral direction. The first layer 112 is used as a layer forming a quantum wire. The second layer 113 is used as a layer forming an energy barrier.

The thickness of each of the plurality of first layers 112 in a thickness direction (a z direction) is greater than or equal to 0.5 nm and less than or equal to 10 nm. The width of each of the plurality of first layers 112 in a lateral direction (a x direction) is greater than or equal to 0.5 nm and less than or equal to 10 nm. The interval between the first layers 112 in a thickness direction (a z direction) is greater than or equal to 0.5 nm and less than or equal to 10 nm. The interval between the first layers 112 in a lateral direction (a x direction) is greater than or equal to 0.5 nm and less than or equal to 10 nm.

The plurality of first layers 112 arranged in a thickness direction (a z direction) may have the same thickness or different thicknesses. The plurality of first layers 112 arranged in a thickness direction (a z direction) may have the same width or different widths in a lateral direction (a x direction). The plurality of first layers 112 arranged in a thickness direction (a z direction) may be arranged at equal intervals or different intervals.

The plurality of first layers 112 arranged in a lateral direction (a x direction) may have the same thickness or different thicknesses. The plurality of first layers 112 arranged in a lateral direction (a x direction) may have the same width or different widths in a lateral direction (a x direction). The plurality of first layers 112 arranged in a lateral direction (a x direction) may be arranged at equal intervals or different intervals.

The first layer 112 can be formed using the same material as a photoelectric conversion layer. Alternatively, the first layer 112 can be formed using a material having a larger energy band gap than that of a material used for the photoelectric conversion layer. For example, the first layer 112 can be formed using the material of the first layer 102 described in Embodiment 1.

The second layer 113 can be formed using a material having a larger energy band gap than that of a material used for the first layer 112. For example, the second layer 113 can be formed using the material of the second layer 103 described in Embodiment 1.

The energy conversion layer 100 having the above structure can be provided so as to be irradiated with the incident light 400 from a thickness direction (a z direction). Alternatively, the energy conversion layer 100 having the above structure can be provided so as to be irradiated with the incident light 400 from a lateral direction (a x direction). In this embodiment, the incident light 400 travels in a downward direction, which is one of thickness directions.

In addition, the energy conversion layer 100 having the above structure has a quantum wire structure. With a quantum wire structure, an electron state around the valence band and the conduction band is quantized in a two-dimensional direction and a state in which energy levels are discrete can be obtained.

The energy conversion layer 100 having the above structure has a function of generating a plurality of photons from one photon. In particular, the energy conversion layer 100 can generate, from one photon of visible light with a shorter wavelength than ultraviolet light, which has high energy, a plurality of photons having lower energy than that of the one photon. Accordingly, it is possible to provide a photoelectric conversion device in which the quantum efficiency of light with a short wavelength such as visible light with a shorter wavelength than ultraviolet light can be increased and energy of light with a short wavelength can be effectively utilized, and an energy conversion layer for the photoelectric conversion device. A mechanism for generating a plurality of photons from one photon is similar to that described using FIGS. 2B and 2C. The quantum wire structure can have a discrete sub-band structure illustrated in FIG. 2B in a x direction as well as in a z direction and is effective for an energy conversion layer.

Although not illustrated in FIG. 4, the energy conversion layer 100 can have a structure including a first unit and a second unit, where the first unit includes a plurality of first layers with a first thickness arranged in a thickness direction (a z direction) and a second layer provided so as to surround the first layer, and the second unit includes a plurality of third layers with a second thickness arranged in a thickness direction (a z direction) and a fourth layer provided so as to surround the third layer. The first thickness and the second thickness may be different from each other. In this case, the plurality of first layers arranged in a thickness direction (a z direction) in the first unit may be provided at intervals which are different from or the same as intervals at which the plurality of third layers arranged in a thickness direction (a z direction) in the second unit are provided. In addition, an embodiment of the present invention is not limited to the two units of the first unit and the second unit, and may include three or more units.

The energy conversion layer 100 described in this embodiment can be combined with the photoelectric conversion element 200 illustrated in FIG. 1A.

In accordance with this embodiment, it is possible to provide a novel photoelectric conversion device in which energy of light can be effectively utilized and performance such as conversion efficiency can be improved. Moreover, it is possible to provide an energy conversion layer for a photoelectric conversion device which can improve the performance of the photoelectric conversion device.

This embodiment can be combined with any of other embodiments as appropriate.

Embodiment 4

Figure 5:
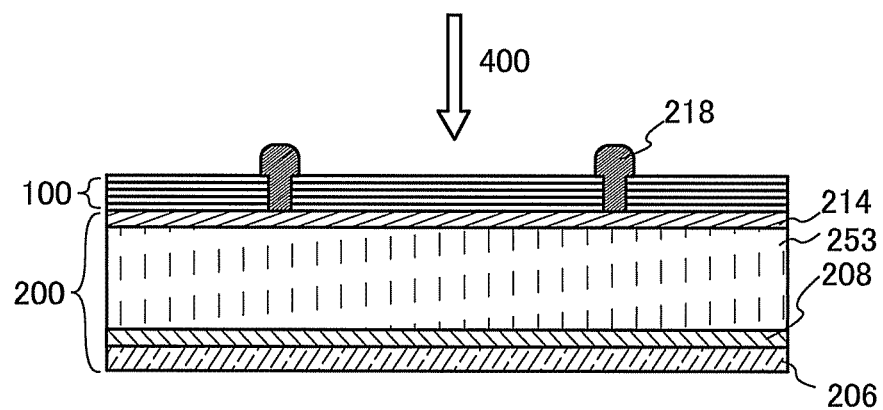
FIG. 5 is a cross-sectional schematic view illustrating an example of a photoelectric conversion device.

In this embodiment, an example of a structure of a photoelectric conversion device according to an embodiment of the disclosed inversion will be described with reference to FIG. 5. FIG. 5 illustrates an example in which a photoelectric conversion element and an energy conversion layer are provided over one substrate.

FIG. 5 is a cross-sectional schematic view illustrating an example of a photoelectric conversion device. The photoelectric conversion device includes a photoelectric conversion element 200 and an energy conversion layer 100 which are stacked. The energy conversion layer 100 is provided on the light-receiving side of a photoelectric conversion layer 253 included in the photoelectric conversion element 200. Incident light 400 enters the photoelectric conversion layer 253 included in the photoelectric conversion element 200 through the energy conversion layer 100.

Any of the structures described in Embodiments 1, 2, and 3 can be used for the energy conversion layer 100. In addition, although not illustrated in FIG. 5, in order to reduce the loss due to reflectivity of light that enters the energy conversion layer 100, one or more layers of a material having a refractive index between the refractive index of a second layer 103 and the refractive index of the air may be provided on the light-receiving side of the energy conversion layer 100.

The photoelectric conversion element 200 includes a first electrode 206, the photoelectric conversion layer 253, and a second electrode 218. In addition, the photoelectric conversion element 200 includes a first semiconductor layer 208 containing an impurity element imparting one conductivity type and a second semiconductor layer 214 containing an impurity element imparting a conductivity type that is different from that of the impurity element contained in the first semiconductor layer 208. In the photoelectric conversion element 200, the first electrode 206, the first semiconductor layer 208, the photoelectric conversion layer 253, the second semiconductor layer 214, and the second electrode 218 are stacked in this order. In the case where a semiconductor substrate is used as the photoelectric conversion layer 253, the first semiconductor layer 208 and the second semiconductor layer 214 are formed in such a manner that impurity elements imparting respective conductivity types are added to the semiconductor substrate by thermal diffusion, an ion doping method, or the like. Alternatively, the first semiconductor layer 208 and the second semiconductor layer 214 may each be formed using a material different from that of the photoelectric conversion layer 253 or a material having a crystal state different from that of the photoelectric conversion layer 253. For example, the structures of the photoelectric conversion layer 253, the first semiconductor layer 208, and the second semiconductor layer 214 described in Embodiment 1 can be employed.

In addition, although each layer in the photoelectric conversion element 200 is illustrated as being flat in FIG. 5, a texture structure in which the shape of the second semiconductor layer 214 and the light-receiving side of the photoelectric conversion layer 253 and the shape of the first semiconductor layer 208 and the rear side of the photoelectric conversion layer 253 are made uneven may be employed. With the texture structure, the reflectivity on the light-receiving side can be reduced and light confinement in the photoelectric conversion layer 253 is possible. Accordingly, photoelectric current can be increased and the photoelectric conversion layer 253 can be thinned, so that costs can be cut.

The energy conversion layer 100 is provided over the second semiconductor layer 214 included in the photoelectric conversion element 200. The second electrode 218 is provided on the energy conversion layer 100. The second electrode 218 is electrically connected to the second semiconductor layer 214 through an opening provided in the energy conversion layer 100.

In accordance with this embodiment, the energy conversion layer 100 is provided directly over the photoelectric conversion element 200, that is, the photoelectric conversion element 200 and the energy conversion layer 100 are provided over one substrate, whereby, as compared to the case where the energy conversion layer 100 is provided over another substrate, cost down, downsizing, and reduction in weight of the photoelectric conversion device can be achieved. In addition, optical loss between the energy conversion layer and the photoelectric conversion layer can be reduced.

In accordance with this embodiment, it is possible to provide a novel photoelectric conversion device in which energy of light can be effectively utilized and performance such as conversion efficiency can be improved. In addition, in accordance with this embodiment, it is possible to provide a photoelectric conversion device in which energy of light with a short wavelength such as visible light with a shorter wavelength than ultraviolet light can be effectively utilized. Moreover, it is possible to provide an energy conversion layer for a photoelectric conversion device which can improve the performance of the photoelectric conversion device.

This embodiment can be combined with any of other embodiments as appropriate.

Embodiment 5

In this embodiment, an example of a structure of an energy conversion layer for a photoelectric conversion device according to an embodiment of the disclosed inversion will be described with reference to FIG. 7.

Figure 7:
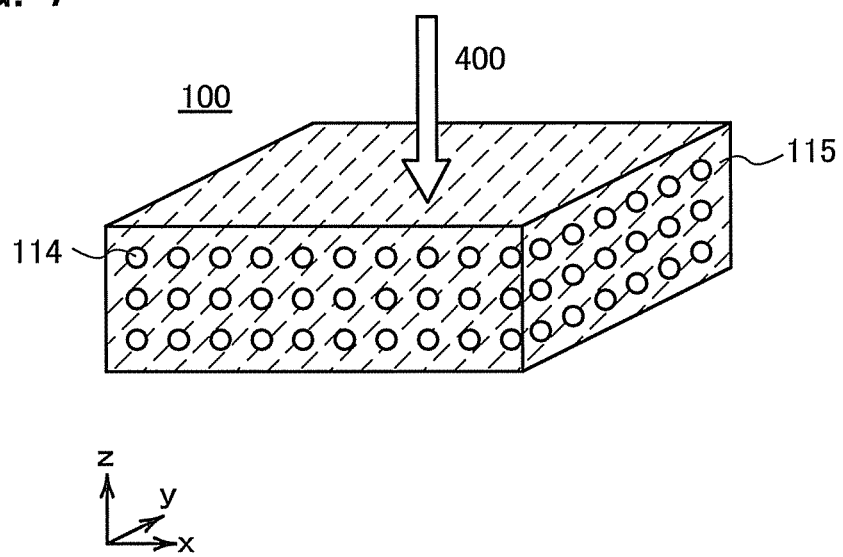
FIG. 7 is a perspective view illustrating an example of an energy conversion layer.

FIG. 7 is a perspective view illustrating an example of an energy conversion layer 100.

The energy conversion layer 100 includes a plurality of quantum dots 114 and a first layer 115. The plurality of quantum dots 114 are surrounded by the first layer 115 in a longitudinal direction (a y direction in FIG. 7), a lateral direction (a x direction in FIG. 7), and a thickness direction (a z direction in FIG. 7). The quantum dot refers to a nanoparticle of a semiconductor, whose diameter is as small as several nanometers. When the nanoparticle is surrounded by a layer with a sufficient large thickness and a high energy barrier three-dimensionally, it becomes a quantum dot. The plurality of quantum dots 114 are arranged uniformly in a longitudinal direction (a y direction in FIG. 7), a lateral direction (a x direction in FIG. 7), and a thickness direction (a z direction in FIG. 7). The first layer 115 is used as a layer forming an energy barrier. The energy conversion layer 100 including the plurality of quantum dots 114 and the first layer 115 forms a quantum dot layer.

The average diameter of the plurality of quantum dots 114 is greater than or equal to 0.5 nm and less than or equal to 10 nm. The interval between the plurality of quantum dots 114 in a longitudinal direction (a y direction in FIG. 7) is greater than or equal to 0.5 nm and less than or equal to 10 nm. In addition, the interval between the plurality of quantum dots 114 in a lateral direction (a x direction in FIG. 7) is greater than or equal to 0.5 nm and less than or equal to 10 nm. In addition, the interval between the plurality of quantum dots 114 in a thickness direction (a z direction in FIG. 7) is greater than or equal to 0.5 nm and less than or equal to 10 nm.

In the quantum dot layer, preferably, the diameters of the plurality of quantum dots 114 do not widely vary from each other in each of a longitudinal direction, a lateral direction, and a thickness direction. It is preferable that the variation between the diameters of the plurality of quantum dots 114 be less than or equal to 50%. When the variation between the diameters is small and the quantum dots 114 excellent in uniformity are arranged in each direction, it is possible to provide a novel photoelectric conversion device in which energy of light can be more effectively utilized and performance such as conversion efficiency can be improved. Note that the quantum dots 114 may be arranged periodically. By arranging the quantum dots 114 periodically in a three-dimensional manner, electronic coupling is caused between the quantum dots 114, so that sub-bands are formed. When optical transition between the sub-bands and a complicated absorption process are utilized, the conversion efficiency can be increased.

The quantum dots 114 can be formed using silicon. In addition, the quantum dots 114 can be formed using the same material as a photoelectric conversion layer or a material having a larger energy band gap than that of a material used for the photoelectric conversion layer. For example, the quantum dots 114 can be formed using the same material as the first layer 102 described in Embodiment 1.

The first layer 115 can be formed using silicon nitride, silicon nitride oxide (SiNxOy, (x>y>0)), silicon oxynitride (SiOxNy, (x>y>0)), or silicon oxide. In addition, the first layer 115 can be formed using a material having a larger energy band gap than that of a material used for the quantum dots 114. For example, the first layer 115 can be formed using the same material as the second layer 103 described in Embodiment 1.

The energy conversion layer 100 having the above structure can be provided so as to be irradiated with incident light 400 from a thickness direction (a z direction). Alternatively, the energy conversion layer 100 having the above structure can be provided so as to be irradiated with the incident light 400 from a lateral direction (a x direction). In this embodiment, the incident light 400 travels in a downward direction, which is one of thickness directions.

The energy conversion layer 100 having the above structure has a quantum dot layer. With the quantum dot layer, an electron state around the valence band and the conduction band is quantized in a three-dimensional direction and a state in which energy levels are discrete can be obtained.

The energy conversion layer 100 having the above structure has a function of generating a plurality of photons from one photon. In particular, the energy conversion layer 100 can generate, from one photon of visible light with a shorter wavelength than ultraviolet light, which has high energy, a plurality of photons having lower energy than that of the one photon. Accordingly, it is possible to provide a photoelectric conversion device in which the quantum efficiency of light with a short wavelength such as visible light with a shorter wavelength than ultraviolet light can be increased and energy of light with a short wavelength can be effectively utilized, and an energy conversion layer for the photoelectric conversion device. A mechanism for generating a plurality of photons from one photon is similar to that described using FIGS. 2B and 2C. The quantum dot structure can have a discrete sub-band structure illustrated in FIG. 2B in a x direction and a y direction as well as in a z direction and is effective for an energy conversion layer.

Figure 8:
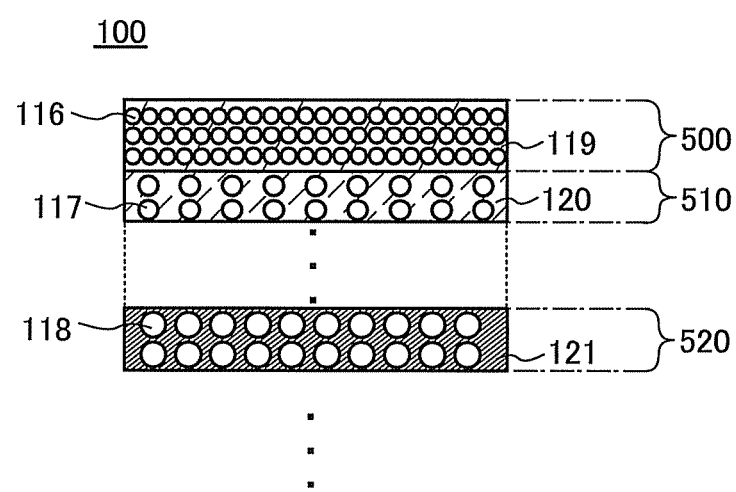
FIG. 8 is a cross-sectional schematic view illustrating an example of an energy conversion layer.

Note that, as illustrated in FIG. 8, the energy conversion layer 100 may include a plurality of quantum dot layers which are stacked. A quantum dot layer 500 includes a plurality of quantum dots 116 and a first layer 119. The plurality of quantum dots 116 are surrounded by the first layer 119 three-dimensionally. A quantum dot layer 510 includes a plurality of quantum dots 117 and a second layer 120. The plurality of quantum dots 117 are surrounded by the second layer 120 three-dimensionally. A quantum dot layer 520 includes a plurality of quantum dots 118 and a third layer 121. The plurality of quantum dots 118 are surrounded by the third layer 121 three-dimensionally.

In such a case, the average diameters of or intervals between the plurality of quantum dots in the plurality of quantum dot layers preferably differ from one quantum dot layer to another. The average diameter of the quantum dots 116 included in the quantum dot layer 500, the average diameter of the quantum dots 117 included in the quantum dot layer 510, and the average diameter of the quantum dots 118 included in the quantum dot layer 520 are each greater than or equal to 0.5 nm and less than or equal to 10 nm. For example, the average diameter of the quantum dots 116 included in the quantum dot layer 500 is about 1.0 nm, the average diameter of the quantum dots 117 included in the quantum dot layer 510 is about 2.0 nm, and the average diameter of the quantum dots 118 included in the quantum dot layer 520 is about 3.0 nm. In each of the quantum dot layers 500, 510, and 520, preferably, the diameters of the plurality of quantum dots do not widely vary from each other. It is preferable that the variation between the diameters of the plurality of quantum dots 116 included in the quantum dot layer 500, the variation between the diameters of the plurality of quantum dots 117 included in the quantum dot layer 510, and the variation between the diameters of the plurality of quantum dots 118 included in the quantum dot layer 520 be each less than or equal to 50%.

By varying the average diameter of the quantum dots included in the quantum dot layer, a so-called quantum size effect can be utilized, with which the wavelength of light which is absorbed can be controlled. Accordingly, it is possible to provide a photoelectric conversion device in which the quantum efficiency of light with a short wavelength such as visible light with a shorter wavelength than ultraviolet light can be increased and energy of light with a short wavelength can be effectively utilized, and an energy conversion layer for the photoelectric conversion device. Note that the quantum dots 116, the quantum dots 117, and the quantum dots 118 may be arranged periodically.

The quantum dots 116, the quantum dots 117, and the quantum dots 118 can be formed using silicon. The quantum dots 116, the quantum dots 117, and the quantum dots 118 can be formed using the same material as a photoelectric conversion layer or a material having a larger energy band gap than that of a material used for the photoelectric conversion layer.

The first layer 119 can be formed using a material having a larger energy band gap than that of a material used for the quantum dots 116. Specifically, the first layer 119 can be formed using silicon nitride, silicon nitride oxide ($SiN_xO_y$, ($x>y>0$)), silicon oxynitride ($SiO_xN_y$, ($x>y>0$)), or silicon oxide. The second layer 120 can be formed using a material having a larger energy band gap than that of a material used for the quantum dots 117. Specifically, the second layer 120 can be formed using silicon nitride, silicon nitride oxide ($SiN_xO_y$, ($x>y>0$)), silicon oxynitride ($SiO_xN_y$, ($x>y>0$)), or silicon oxide. The third layer 121 can be formed using a material having a larger energy band gap than that of a material used for the quantum dots 118. Specifically, the second layer 120 can be formed using silicon nitride, silicon nitride oxide ($SiN_xO_y$, ($x>y>0$)), silicon oxynitride ($SiO_xN_y$, ($x>y>0$)), or silicon oxide.

The energy conversion layer 100 described in this embodiment can be combined with the photoelectric conversion element 200 illustrated in FIG. 1A.

In accordance with this embodiment, it is possible to provide a novel photoelectric conversion device in which energy of light can be effectively utilized and performance such as conversion efficiency can be improved. Moreover, it is possible to provide an energy conversion layer for a photoelectric conversion device which can improve the performance of the photoelectric conversion device.

This embodiment can be combined with any of other embodiments as appropriate.

Example 1

In this example, the energy conversion layer 100 illustrated in FIG. 1B was formed and its cross section was observed.

A glass substrate was prepared as a substrate. Over the glass substrate, a silicon nitride ($SiN_x$ ($x>0$)) layer with a thickness of 6.5 nm was formed as a second layer 703 by a plasma CVD method.

Then, by a plasma CVD method, a silicon layer with a thickness of 3 nm was formed as a first layer 702 over the second layer 703, and then, another silicon nitride ($SiN_x$ ($x>0$)) layer with a thickness of 6.5 nm was formed as the second layer 703 over the first layer 702. The above process was repeated 20 times, whereby an energy conversion layer having a quantum well structure was formed. The silicon layer as the first layer 702 was formed by a plasma CVD method using a monosilane ($SiH_4$) gas and a hydrogen ($H_2$) gas as a source gas in which the mass flow ratio was $SiH_4$:$H_2$=8:400. In order to form the silicon layer as the first layer 702, plasma was generated under the condition that high-frequency power was 15 W (frequency: 60 MHz), film formation temperature (substrate temperature) was 300° C., pressure in a treatment chamber was 100 Pa, and the distance between electrodes was 20 mm. The silicon nitride ($SiN_x$ ($x>0$)) layer as the second layer 703 was formed by a plasma CVD method using a monosilane ($SiH_4$) gas, an ammonia ($NH_3$) gas, and an argon (Ar) gas as a source gas in which the mass flow ratio was $SiH_4$:$NH_3$:Ar=5:400:50. In order to form the silicon nitride ($SiN_x$ ($x>0$)) layer as the second layer 703, plasma was generated under the condition that high-frequency power was 500 W (frequency: 27 MHz), film formation temperature (substrate temperature) was 300° C., pressure in a treatment chamber was 30 Pa, and the distance between electrodes was 20 mm.

Figure 6:
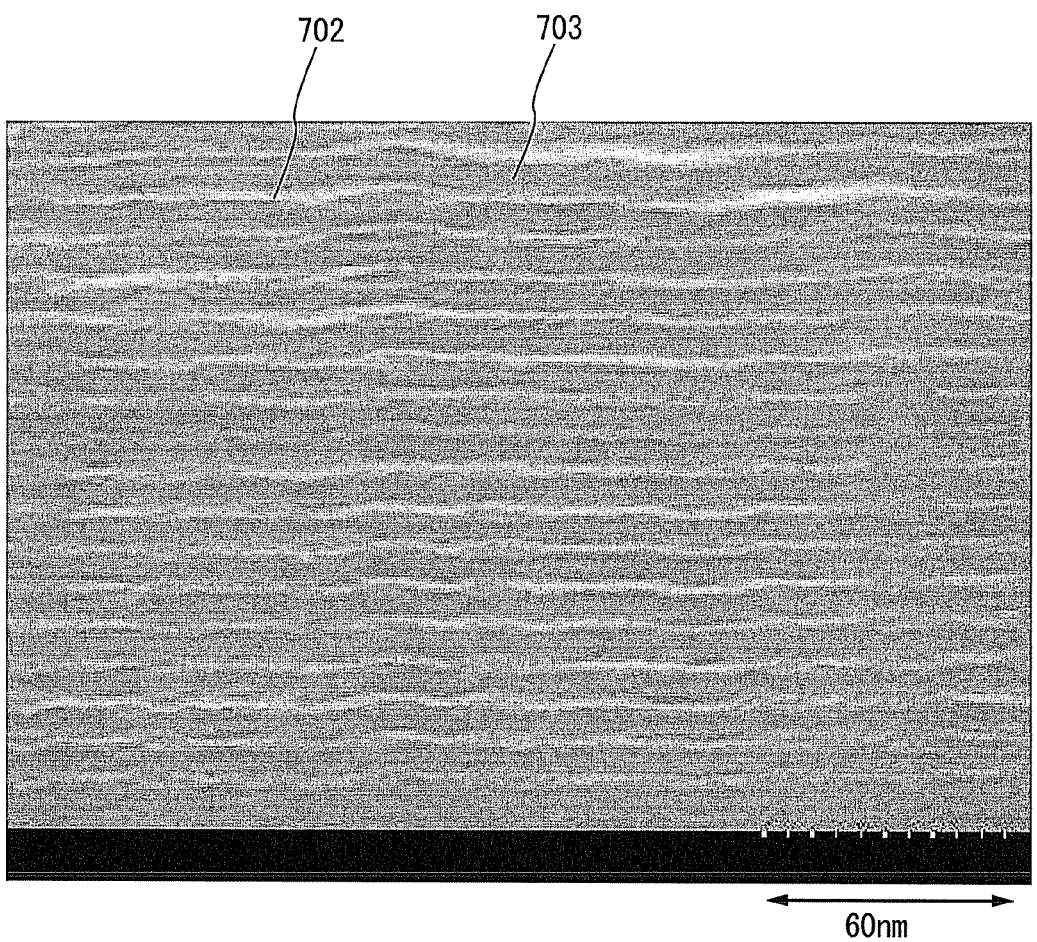
FIG. 6 is a photograph of a cross section of an energy conversion layer.

FIG. 6 is a cross-sectional photograph of the energy conversion layer which was formed herd. From FIG. 6, a structure in which the first layer 702 formed using silicon with a thickness of about 3 nm and the second layer 703 formed using silicon nitride with a thickness of about 6.5 nm were alternately stacked was observed.

Example 2

In this example, the energy conversion layer 100 illustrated in FIG. 7 was formed and its cross section was observed.

Over a glass substrate prepared as a substrate, silicon was deposited to a thickness of 5 nm by a plasma CVD method. Quantum dots were formed by growth into an island-shape in the initial stage of the process for depositing silicon. Then, by a plasma CVD method, a silicon nitride (SiNx (x>0)) layer with a thickness of 5 nm was formed as a first layer and subjected to $N_2O$ plasma treatment for 1 minute. This process was repeated 20 times, whereby the energy conversion layer having a quantum dot structure was formed. The quantum dots formed of silicon were formed by a plasma CVD method using a monosilane ($SiH_4$) gas and a hydrogen ($H_2$) gas as a source gas in which the mass flow ratio was $SiH_4:H_2=8:400$. In order to form the quantum dots formed of silicon, plasma was generated under the condition that high-frequency power was 15 W (frequency: 60 MHz), film formation temperature (substrate temperature) was 300° C., pressure in a treatment chamber was 100 Pa, and the distance between electrodes was 20 mm. The silicon nitride (SiNx (x>0)) layer as the first layer was formed by a plasma CVD method using a monosilane ($SiH_4$) gas, an ammonia ($NH_3$) gas, and an argon (Ar) gas as a source gas in which the mass flow ratio was $SiH_4:NH_3:Ar=5:400:50$. In order to form the silicon nitride (SiNx (x>0)) layer as the first layer, plasma was generated under the condition that high-frequency power was 500 W (frequency: 27 MHz), film formation temperature (substrate temperature) was 300° C., pressure in a treatment chamber was 30 Pa, and the distance between electrodes was 20 mm. In addition, the $N_2O$ plasma treatment performed after the formation of the silicon nitride layer was performed under the condition that the flow of the $N_2O$ gas was 400 sccm, high-frequency power was 300 W (frequency: 27 MHz), substrate temperature was 300° C., pressure in a treatment chamber was 60 Pa, and the distance between electrodes was 30 mm.

Figure 9:
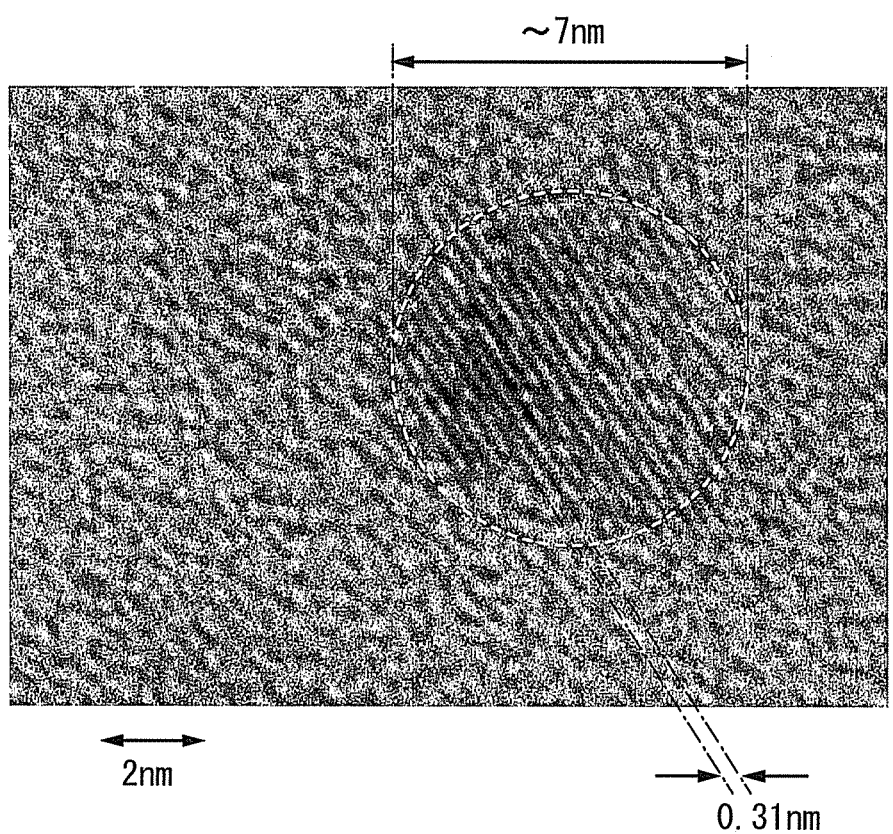
FIG. 9 is a photograph of a cross section of an energy conversion layer.

FIG. 9 is a cross-sectional photograph of the energy conversion layer which was formed here. From FIG. 9, quantum dots with a diameter of about 7 nm provided with interplanar spacing, which corresponds to (111) plane of single crystal silicon, of about 0.31 nm were observed.

This application is based on Japanese Patent Application serial no. 2010-139746 filed with Japan Patent Office on Jun. 18, 2010, the entire contents of which are hereby incorporated by reference.

What is claimed is:

1. A photoelectric conversion device comprising:
 a photoelectric conversion element comprising:
  a first electrode;
  a first semiconductor layer over the first electrode;
  a photoelectric conversion layer over the first electrode;
  a second semiconductor layer over the photoelectric conversion layer; and
  a second electrode over and in contact with the second semiconductor layer; and
 an energy conversion layer over the photoelectric conversion element,
 wherein the energy conversion layer comprises a plurality of first layers and a plurality of second layers alternately stacked, and
 wherein the second electrode passes through the energy conversion layer.

2. The photoelectric conversion device according to claim 1, wherein the energy conversion layer has a quantum well structure.

3. The photoelectric conversion device according to claim 1,
 wherein the first semiconductor layer and the second semiconductor layer comprise silicon having different conductivity types.

4. The photoelectric conversion device according to claim 1,
 wherein the second electrode has a grid shape or a comb-like shape.

5. The photoelectric conversion device according to claim 1,
 wherein the photoelectric conversion layer comprises any one of silicon and a silicon material containing nitrogen or carbon.

6. The photoelectric conversion device according to claim 1,
 wherein an uppermost layer and a lowermost layer of the energy conversion layer each comprise the second layers.

7. The photoelectric conversion device according to claim 1,
 wherein a thickness of the energy conversion layer is greater than or equal to 20 nm and less than or equal to 10 µm.

8. The photoelectric conversion device according to claim 1,
 wherein the energy conversion layer is configured to generate a plurality of photons from one photon.

9. A photoelectric conversion device comprising:
 a photoelectric conversion element comprising:
  a first electrode;
  a first semiconductor layer over the first electrode;
  a photoelectric conversion layer over the first electrode;
  a second semiconductor layer over the photoelectric conversion layer; and
  a second electrode over and in contact with the second semiconductor layer; and
 an energy conversion layer over the photoelectric conversion element,
 wherein the energy conversion layer comprises a plurality of first layers and a plurality of second layers alternately stacked,
 wherein each of the plurality of first layers comprises silicon,
 wherein each of the plurality of second layers comprises any one of silicon nitride, silicon nitride oxide, silicon oxynitride, and silicon oxide, and
 wherein the second electrode passes through the energy conversion layer.

10. The photoelectric conversion device according to claim 9, wherein the energy conversion layer has a quantum well structure.

11. The photoelectric conversion device according to claim 9,
 wherein the first semiconductor layer and the second semiconductor layer comprise silicon having different conductivity types.

12. The photoelectric conversion device according to claim 9, wherein the second electrode has a grid shape or a comb-like shape.

13. The photoelectric conversion device according to claim 9,
wherein the photoelectric conversion layer comprises any one of silicon and a silicon material containing nitrogen or carbon.

14. The photoelectric conversion device according to claim 9,
wherein an uppermost layer and a lowermost layer of the energy conversion layer each comprise the second layers.

15. The photoelectric conversion device according to claim 9,
wherein a thickness of the energy conversion layer is greater than or equal to 20 nm and less than or equal to 10 μm.

16. The photoelectric conversion device according to claim 9,
wherein the energy conversion layer is configured to generate a plurality of photons from one photon.

17. The photoelectric conversion device according to claim 1,
wherein a thickness of each of the plurality of first layers is greater than or equal to 0.5 nm and less than or equal to 10 nm, and
wherein a thickness of each of the plurality of second layers is greater than or equal to 0.5 nm and less than or equal to 10 nm.

18. The photoelectric conversion device according to claim 9,
wherein a thickness of each of the plurality of first layers is greater than or equal to 0.5 nm and less than or equal to 10 nm, and
wherein a thickness of each of the plurality of second layers is greater than or equal to 0.5 nm and less than or equal to 10 nm.

19. The photoelectric conversion device according to claim 1,
wherein the photoelectric conversion layer is in direct contact with the energy conversion layer.

20. The photoelectric conversion device according to claim 9,
wherein the photoelectric conversion layer is in direct contact with the energy conversion layer.

* * * * *